(12) United States Patent
Kim et al.

(10) Patent No.: US 7,174,068 B2
(45) Date of Patent: Feb. 6, 2007

(54) PARABOLIC WAVEGUIDE-TYPE COLLIMATING LENS AND TUNABLE EXTERNAL CAVITY LASER DIODE PROVIDED WITH THE SAME

(75) Inventors: Hyun-Soo Kim, Daejon (KR); Eun Deok Sim, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/290,295

(22) Filed: Nov. 30, 2005

(65) Prior Publication Data

US 2006/0269190 A1    Nov. 30, 2006

(30) Foreign Application Priority Data

May 31, 2005    (KR) .................. 10-2005-0046155

(51) Int. Cl.
*G02B 6/32* (2006.01)
(52) U.S. Cl. .................. 385/33; 385/129; 385/130
(58) Field of Classification Search ........ 385/129–132, 385/33–36
See application file for complete search history.

(56) References Cited

U.S. PATENT DOCUMENTS

| | | | | |
|---|---|---|---|---|
| 4,896,325 | A | | 1/1990 | Coldren |
| 5,146,248 | A | * | 9/1992 | Duwaer et al. ............. 353/122 |
| 5,560,700 | A | * | 10/1996 | Levens ...................... 362/558 |
| 5,768,339 | A | * | 6/1998 | O'Hara ...................... 378/147 |
| 5,771,252 | A | | 6/1998 | Lang et al. |
| 6,452,726 | B1 | * | 9/2002 | Mandella ................... 359/641 |
| 6,464,365 | B1 | | 10/2002 | Gunn et al. |
| 7,035,524 | B2 | * | 4/2006 | Aoki et al. ................. 385/140 |

(Continued)

FOREIGN PATENT DOCUMENTS

| | | |
|---|---|---|
| EP | 0 717 476 | 6/1996 |
| FR | 2 595 013 | 8/1987 |
| JP | 57-27086 | 2/1982 |

OTHER PUBLICATIONS

"A Collimation Mirror in Polymeric Planar Waveguide Formed by Reactive Ion Etching," Jin-Ha Kim et al, IEEE Phototronics Technology Letters, vol. 15, No. 3, Mar. 2003, pp. 422-424, © 2003 IEEE.

(Continued)

*Primary Examiner*—Kevin S. Wood
(74) *Attorney, Agent, or Firm*—Ladas & Parry LLP

(57) ABSTRACT

The present invention relates to a semiconductor based parabolic waveguide-type collimating lens and a monolithically integrated type tunable external cavity laser diode light source. The monolithically integrated type tunable external cavity laser diode light source includes a gain medium for generating a gain of an optical signal, a collimating lens for correcting a divergent light beam to a parallel light beam, a passive waveguide through which the parallel light beam travels, an optical deflector to change a traveling direction of the parallel light beam changing a refractive index of medium on a traveling path of the parallel light beam traveling through the slab waveguide in response to an external electric signal and a diffraction grating to diffract the parallel light beam passing through the optical deflector, wherein these are integrate into one substrate made of an InP-based semiconductor as well as a material such as a GaAs-based semiconductor, a Si-based semiconductor, LiNbO$_3$-based semiconductor or the like.

3 Claims, 20 Drawing Sheets

U.S. PATENT DOCUMENTS

2002/0030800 A1   3/2002   Nellissen
2003/0112838 A1   6/2003   Oh et al.

OTHER PUBLICATIONS

"Widely Tunable External Cavity Diode Laser Using a MEMS Electrostatic Rotary Actuator," Jill D. Berger et al, Proceedings of the 27th European Conference on Optical Communications (ECOC '01—Amsterdam), pp. 198-199.

'InGaAsP/InP Laser Diodes Monolithically Integrated with Waveguide-Type Light Deflectors' Kim et al., Japanese Journal of Applied Physics, vol. 43, No. 4B, 2004, pp. L543-544.

'Proposal of Electrically Tunable External-Cavity Laser Diode' Kwon et al., IEEE Photonics Technology Letters, vol. 16, No. 8, Aug. 2004, pp. 1804-1806.

* cited by examiner

A-A' cross section

B-B' cross section

C-C' cross section

D-D' cross section

E-E' cross section

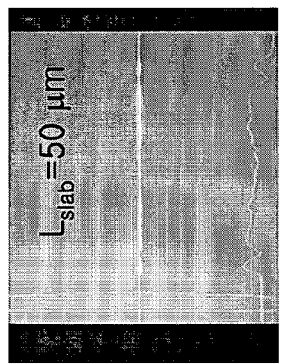 FIG. 11A $L_{slab}=50\ \mu m$
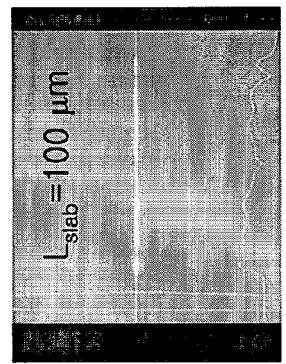 FIG. 11B $L_{slab}=100\ \mu m$
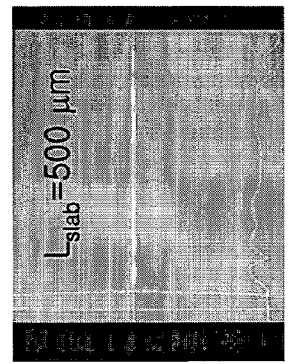 FIG. 11C $L_{slab}=500\ \mu m$ A-A' cross section B-B' cross section C-C' cross section D-D' cross section E-E' cross section A-A' cross section A-A' cross section A-A' cross section E-E' cross section E-E' cross section E-E' cross section E-E' cross section E-E' cross section

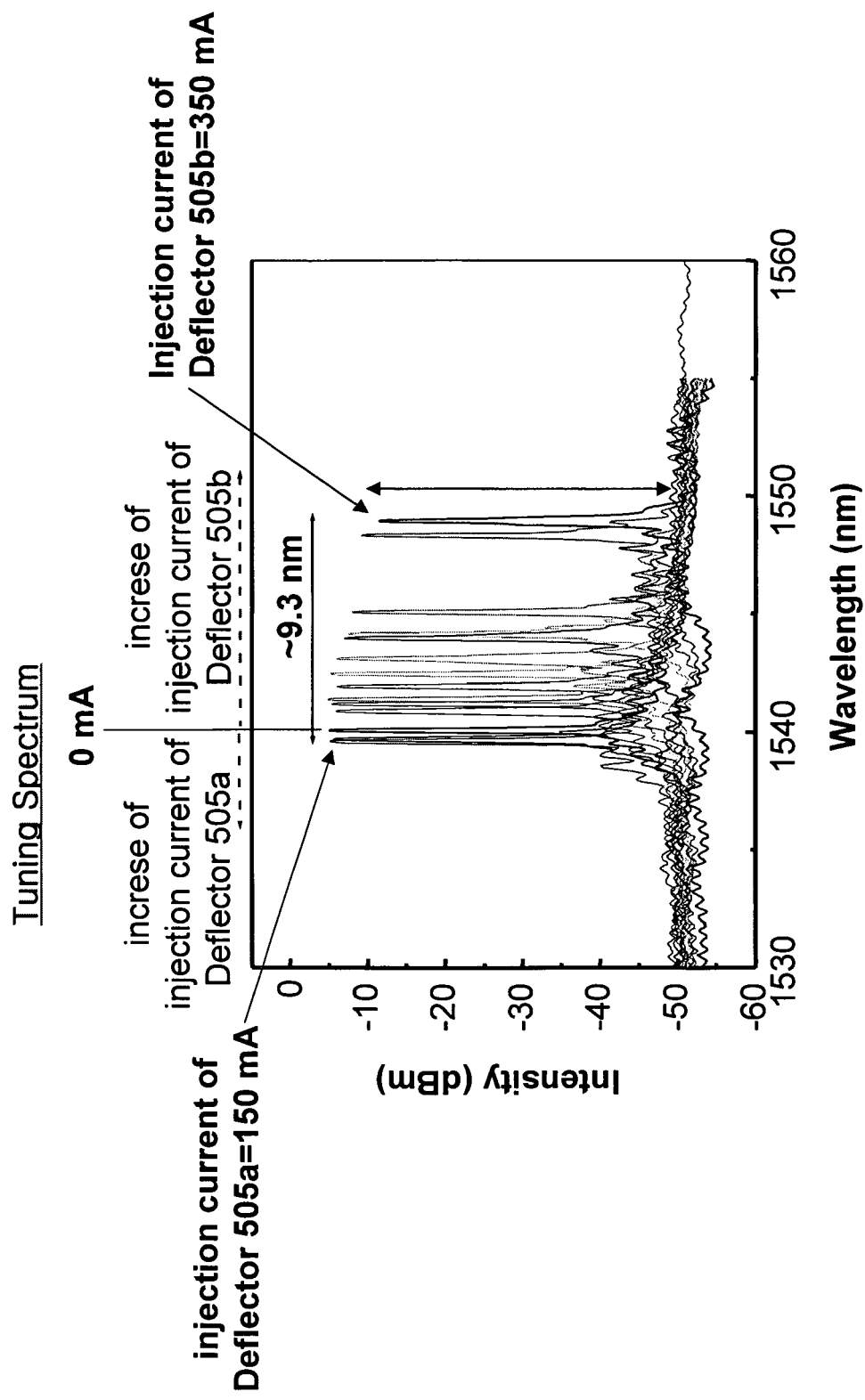

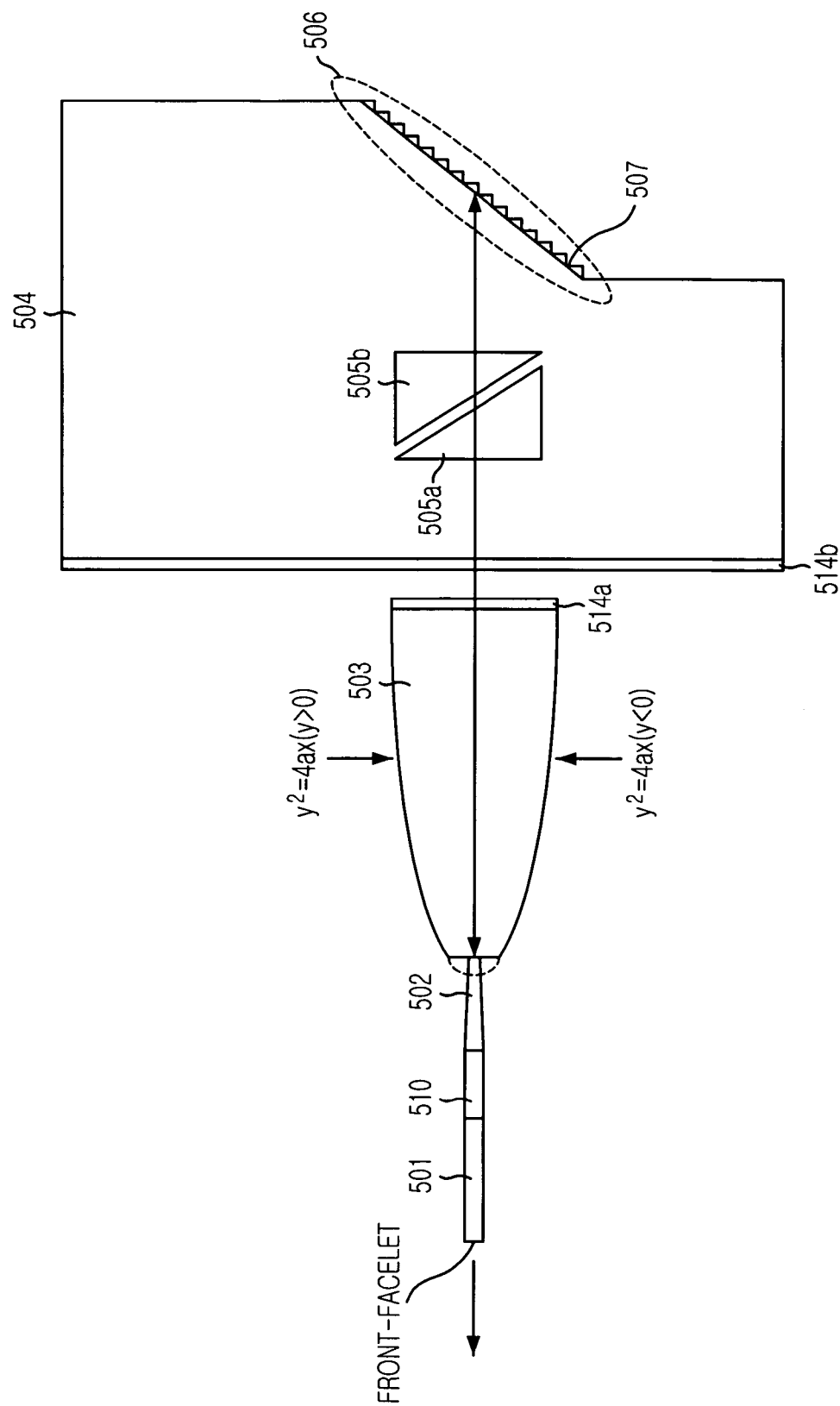

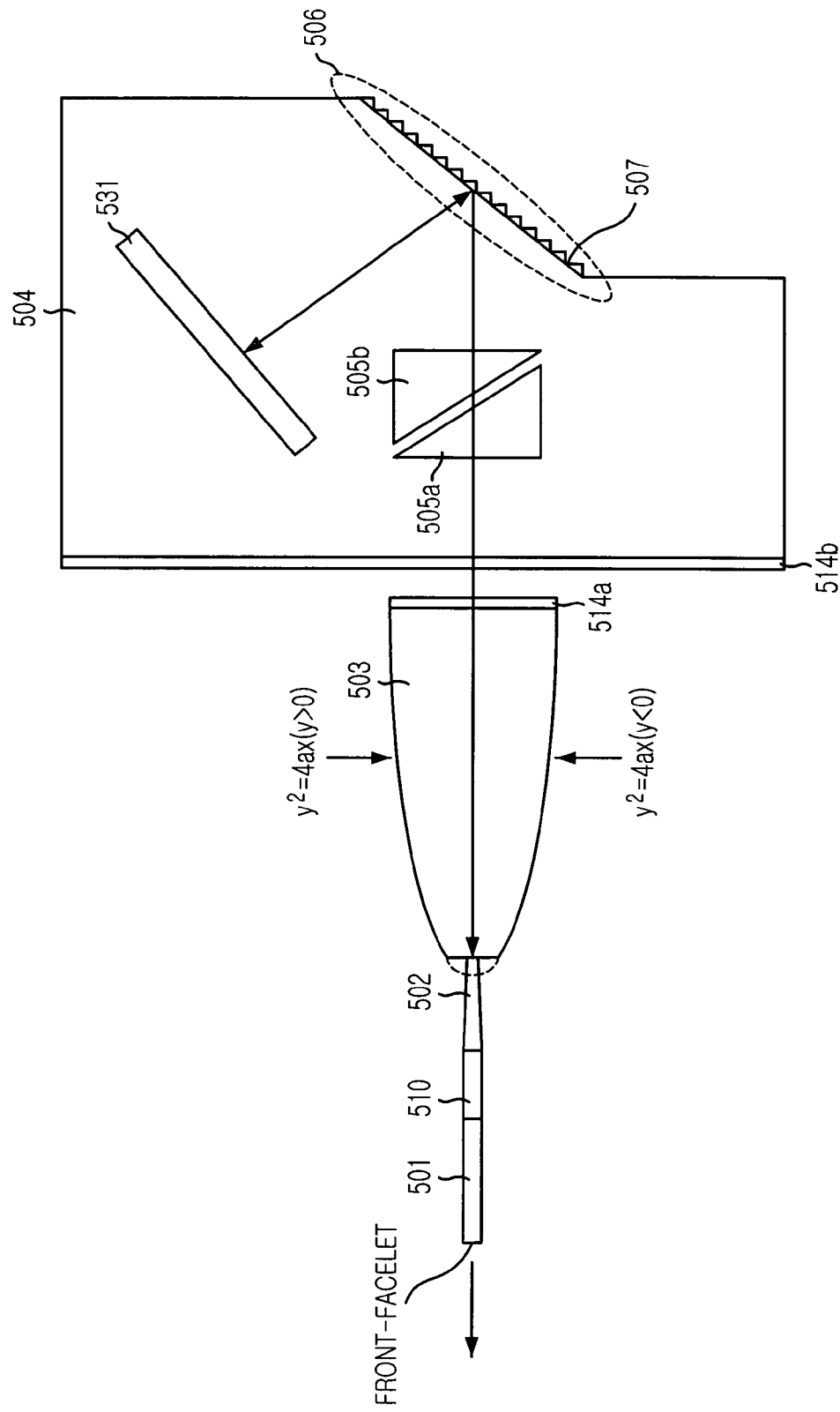

PARABOLIC WAVEGUIDE-TYPE COLLIMATING LENS AND TUNABLE EXTERNAL CAVITY LASER DIODE PROVIDED WITH THE SAME

FIELD OF THE INVENTION

The present invention relates to a parabolic waveguide-type collimating lens and a tunable external cavity laser diode provided with the same; and, more particularly, to a parabolic waveguide-type collimating lens capable of implementing continuous wavelength tunable characteristics without a mode hopping and a tunable external cavity laser diode provided with the same.

DESCRIPTION OF RELATED ART

In general, a Littman-Metcalf type external cavity and a Littrow type external cavity are frequently used for selecting a specific wavelength as an external cavity to select the specific wavelength from a gain medium having a predetermined range of gain bandwidth using a diffraction grating.

A conventional wavelength tunable laser diode technology is an external cavity laser diode to vary the wavelength by mechanically moving a diffraction grating or a reflection mirror using MEMS (micro-electro-mechanical systems).

However, the conventional technology is difficult in packaging thereof since it is constructed by various optical elements and the driving parts of the MEMS technology, and it has an disadvantage that is susceptible to an external vibration. And, it has another disadvantage that requires an anti-reflection thin film of a high quality and cost formed on a facet of the semiconductor laser.

FIG. 1 is a schematic diagram showing a Littman-Metcalf type external cavity laser diode light source according to a prior art.

Referring to FIG. 1, the Littman-Metcalf type external cavity includes a gain medium 101 having a wide wavelength bandwidth, a collimating lens 102 for making a light beam generated from the gain medium 101 parallel, a diffraction grating for diffracting the parallel light beam and a reflection mirror 104 for reflecting the diffracted light beam.

If the light beam is generated from the gain medium 101, the generated light beam is converged in parallel by the collimating lens 102, and the parallel light beam is diffracted to the reflection mirror 104 by the diffraction grating 103. The wavelength of the light beam generated at this time is as follows:

$$m\lambda = nd(\sin \alpha + \sin \beta) \quad \text{Eq. 1}$$

wherein the m represents the order of diffraction, the n represents a refraction index, the d represents a period of the diffraction grating, the α represents an incidence angle and the β represents a diffraction angle.

In general, since the order of diffraction and the period of the diffraction grating are determined at the time of the manufacture thereof, in order to achieve wavelength tuning in the Littman-Metcalf type external cavity laser diode, the incidence angle to impinge onto the diffraction angle is changed or the angle of the reflection mirror is changed.

Although an emitting facet of the gain medium 101 is made of a cleaved-facet or a reflection thin film, it is essentially required that a high quality of anti-reflection thin film 106 is deposited on the facet placed at the inside of the gain medium 101 to suppress the multi-wavelength oscillation due to a Fabry-Perot resonator.

In FIG. 1, the reflection mirror 104 controls the angle toward the diffraction grating 103 by a mechanical apparatus, therefore the reflection mirror 104 can reflect only the vertically incident light beam with a specific wavelength among the light beams incident to the reflection mirror 104 to the diffraction grating 103. The light beam reflected back to the diffraction grating 103 is returned to the laser diode 101 through the collimating lens 102 again diffracted by the diffraction grating 103.

If the reflection mirror 104 is rotated from a position 104a to a position 104b, a type of light beams impinged vertically onto the reflection mirror 104 is changed. That is, although a first light beam 105a with a predetermined wavelength is vertically impinged onto the position 104a of the reflection mirror 104 to be reflected to the diffraction grating 103, if a position of the reflection mirror is changed to the position 104b due to the rotation of the reflection mirror 104, a second light beam 105b with another wavelength is vertically impinged onto the reflection mirror 104 to be reflected to the diffraction grating 103. Therefore, according to the angle at which the reflection mirror 104 is arranged, the wavelength of the light beam reflected back to the gain medium 101 is changed and the wavelength tuning is implemented in response to the angle of the reflection mirror 104. As like this, it should be noted that the Littman-Metcalf type external cavity can vary the wavelength by controlling the angle of the reflection mirror 104.

On the other hand, the Littrow type external cavity laser diode light source can vary the wavelength by controlling the angle of the diffraction grating. FIG. 2 is a block diagram illustrating a schematic diagram showing a Littrow type external cavity laser diode light source according to a prior art.

Referring to FIG. 2, the structure of the Littrow type external cavity laser diode light source is similar to that of the Littman-Metcalf external cavity laser diode light source. Merely, the Littrow type external cavity laser diode light source can vary the wavelength by not controlling the angle of the reflection mirror 104, but controlling the angle of the diffraction grating 103. The wavelength of the light beam oscillated at this time is as follows:

$$m\lambda = 2nd \sin \alpha \quad \text{Eq. 2}$$

wherein the m represents the order of diffraction, the n represents a refraction index, the d represents a period of the diffraction grating and the α represents an incidence angle (a diffraction angle β is equal to the incidence angle α).

As described in the description of FIG. 1, a front-facet 107 of the gain medium 101 is made of a cleaved-facet or a reflection thin film, it is essentially required that a high quality of anti-reflection thin film 106 is deposited on the cross-section placed at the inside of the gain medium 101 to suppress the multi-wavelength oscillation due to a Fabry-Perot resonator.

Similarly, as like in the above-described Littman-Metcalf external cavity laser diode light source, since the order of diffraction and the period of the diffraction grating are determined at the time of the manufacture thereof, the wavelength can be tuned by changing the incidence angle impinging onto the diffraction grating.

If the light beam is generated from the gain medium 101, the generated light beam is converged in parallel by the collimating lens 102, and the light beam having the specific wavelength is reflected back to the gain medium 101 through the collimating lens 102 by diffracting the light beam having the specific wavelength in response to an angle of the diffraction grating 103.

Finally, the tuning of the resonance wavelength is implemented by changing the wavelength of the light beam reflected back to the gain medium 101 in response to the angle at which the diffraction grating 103 is arranged.

As described above, the conventional Littman-Metcalf or the Littrow type external cavity tunable laser can select the light beam having the specific wavelength by controlling the angle, wherein the control of the angle is achieved by mechanically rotating the reflection mirror or the diffraction grating. Therefore, since the reflection mirror or the diffraction grating is mechanically rotated precisely, it has disadvantages that the stability of the laser is decreased; the laser is susceptible to an external vibration; the laser has a large size; and the laser requires a number of optical elements during the packaging thereof. And, it has another disadvantage that increases the manufacturing cost since the optical alignment is not easy.

And, a SGDBR (sampled-grating distributed Bragg reflector) and a SSDBR (super-structure distributed Bragg reflector) or the like are employed as other different conventional tunable light sources. FIG. 3 is a schematic diagram showing a SGDBR type tunable semiconductor laser according to a prior art.

Since the SGDBR tunable semiconductor laser is made of 4 input injection current control parts, i.e., a gain section, two SGDBR parts and a phase shift section, it has an disadvantage that the operational condition of the specific wavelength is difficult to be found.

On the other hand, in FIG. 3, a reference numeral 201 represents a gain medium (active waveguide), a reference numeral 202 represents a passive waveguide, a reference numeral 203 represents the SGDBR, a reference numeral 204 represents an anti-reflection thin film, a reference numeral 205 represents a bottom ohmic contact, a reference nuberal 206 represents an ohmic layer and a reference numeral 207 represents an ohmic electrode, respectively.

FIG. 4 is a plan view depicting a conventional semiconductor based parabolic reflection mirror.

Referring to FIG. 4, the light beam incident to the optical fiber is transmitted to an input passive waveguide 302, thereby dispersing to the slab waveguide 301 at a radiation angle θ. The dispersed light beam becomes a parallel light beam 307 reflected to a direction parallel to the x-direction by a parabolic TIR (total internal reflection) mirror 304 etched by a RIE (reactive ion etching).

At this time, the parabolic mirror reflects the light beam impinged thereon by a Snell's law due to the difference between the refractive index of the passive waveguide 302 and the refractive index of the air, preferably if the incidence angle(γ) 306 incident to the parabolic mirror is above a critical angle, a loss generated at the reflection mirror is minimized by totally reflecting the light beam at the parabolic reflection mirror.

FIGS. 5a to 5c are cross-sectional views illustrating a semiconductor based parabolic reflection mirror taken along lines A–A', B–B' and C–C' of FIG. 4. The substrate is made of one of Si, InP based semiconductor and GaAs based semiconductor. A bottom clad layer 311, a passive waveguide core layer 312 and a top clad layer 313 are formed on the substrate. And, the input passive waveguide and the parabolic total reflection mirror form an air layer 314 using the RIE.

FIG. 6 is a graph depicting the formation of parallel light of the semiconductor based parabolic reflection mirror shown in FIG. 4 according to the prior art.

As shown in FIG. 6, the light beam incident to the focus F(a, 0) in the parabola is reflected as a beam parallel to the x-axis at any incidence angles. On the other hand, a line given according to the definition of the parabola is a set of points that a distance between a point at the given line and the focus F(a, 0) is equal to a distance between the point at the given line and a point vertical to a line, i.e., x=−a. Therefore, it is apparent that the reflected light beam 307 is a parallel light beam since the distances from the focus F(a, 0) to an arbitrary line x=s via the given line are always equal to each other without depending on the incidence angle.

However, in the parabolic reflection mirror, since there exists a 90° difference between the direction of the input beam and the direction of the output beam, it has a shortcoming that the degree of integration is low on the wafer during the manufacturing thereof. Since it is not easy in exactly recognizing the position of the parallel light beam emitted after the manufacture, it has a problem that is not easy in optically aligning an optical fiber with a micro lens.

And also, since the size of the outputted parallel light beam is controlled only the radiation angle and the size of focus traveling toward the slab waveguide from the input passive waveguide, there is a limitation in arbitrary adjusting the size of the outputted parallel light beam. Additionally, since the radiation angle traveling toward the slab waveguide is dependent on the width of the passive waveguide and the thickness and the refraction index of the core layer of the passive waveguide, the width of the input passive waveguide, there is a shortcoming that the size of the outputted parallel light beam is changed in response to the thickness and the refraction index of the core layer of the passive waveguide in the collimating lens having the same focus size.

In general, the thickness and the refractive index of the core layer of the slab waveguide and the width of the input passive waveguide are slightly changed in response to a short term or a long term in a process such as a material growing process, a photolithography process, an RIE etching process, a wet etching process or the like.

SUMMARY OF THE INVENTION

It is, therefore, an object of the present invention to provide a parabolic waveguide-type collimating lens capable of monolithically integrating gain medium, slab waveguide, optical deflector and diffraction grating.

It is another object of the present invention to provide a monolithically integrated tunable external cavity laser diode stably operated at an external vibration by varying the direction of a light beam through the change of a refraction index in response to an electric or a thermal change.

It is another object of the present invention to provide a monolithically integrated tunable external cavity laser diode having excellent wavelength selection characteristics with reducing the manufacturing cost thereof.

In accordance with an aspect of the present invention, there is provided a tunable external cavity laser diode including a collimating lens to correct an divergent light beam to a parallel light beam, a slab waveguide for traveling the parallel light beam therethrough and an optical deflector to change the traveling direction of the light beam by changing the refraction index of the medium on a traveling path of the light beam traveling through the slab waveguide in response to an external electric signal.

That is, a tunable external cavity laser diode in response to the present invention is provided with an optical deflector operated in response to an electric signal different from a conventional Littman-Metcalf type and Littrow type external cavity structures, thereby changing the oscillation wavelength by the electric signal without the mechanical movement of the cavity construction elements.

In accordance with another aspect of the present invention, there is provided a tunable external cavity laser diode integrating a collimating lens and a gain medium in place of a conventional bulk type collimating lens into one and provided with an optical deflector capable of varying the direction of a light beam in response to an electric signal and a thermal change and a diffraction grating.

In accordance with another aspect of the present invention, there is provided a semiconductor based collimating lens including an input waveguide receiving a light beam from outside and a parabolic waveguide for correcting the divergent light beam from the input waveguide to a parallel light beam, wherein the parabolic waveguide is changed from a parabolic shape symmetric with respect to a traveling direction line of the light beam inputted through the input waveguide to a shape removing the polar point portion by a straight line vertical to the symmetric axis passing the focus of the parabola. Preferably, the radiation angle is increased or decreased, when the light beam is propagated from the input waveguide to the parabola waveguide, by tapering the width of the input waveguide.

And also, since one embodiment of a tunable optical deflector operated by an electric signal in accordance with the present invention includes a slab waveguide made of a material such as an InP or GaAs based semiconductor and a partial p/n junction in the form of a triangular shape in plane, it is characterized in that the direction of a light beam passing through a slab waveguide of a tunable optical deflector in the form of a triangle can be arbitrarily controlled by the change of a refractive index due to a carrier density change of the slab waveguide or an electro optic effect in response to the current injection or the voltage applying. Or, the tunable optical deflector is a slab waveguide made of a material such as an InP, GaAs based semiconductor, a silicon based semiconductor or a polymer based material and is formed by depositing a metal having a certain degree of resistance on the top portion in the form of a triangle in plane. And, it is characterized in that it can be arbitrarily controlled the direction of a light beam passing through the slab waveguide using the change of a refractive index by a change of the temperature in response to an electric signal.

Preferably, to increase the tuning range of the wavelength, the tunable optical deflector can change a specific wavelength into a short wavelength and a long wavelength centering around the specific wavelength.

BRIEF DESCRIPTION OF THE DRAWINGS

The above and other objects and features of the present invention will become apparent from the following description of the preferred embodiments given in conjunction with the accompanying drawings, in which:

FIGS. 11a to 11c are near field images of the parabolic waveguide-type collimating lens in accordance with the present invention;

FIG. 18 is a graph showing a wavelength tunable characteristics in response to an injection current of an optical deflector in the Littrow type monolithically integrated tunable external cavity laser diode manufactured in accordance with the embodiment of the present invention;

FIG. 21 is a schematic diagram representing a Littrow type hybrid integrated tunable external cavity laser diode light source in accordance with an embodiment of the present invention; and FIG. 22 is a schematic diagram describing a Littman-Metcalf type hybrid integrated tunable external cavity laser diode light source in accordance with an embodiment of the present invention.

DETAILED DESCRIPTION OF THE INVENTION

Figure 1:
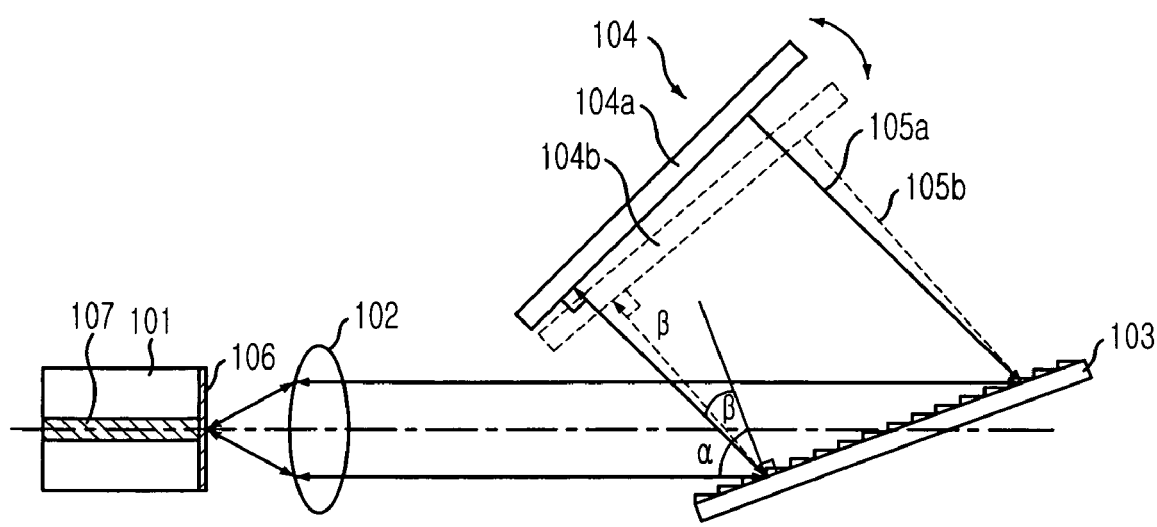
FIG. 1 is a schematic diagram showing a Littman-Metcalf type external cavity laser diode light source according to a prior art.
Figure 2:
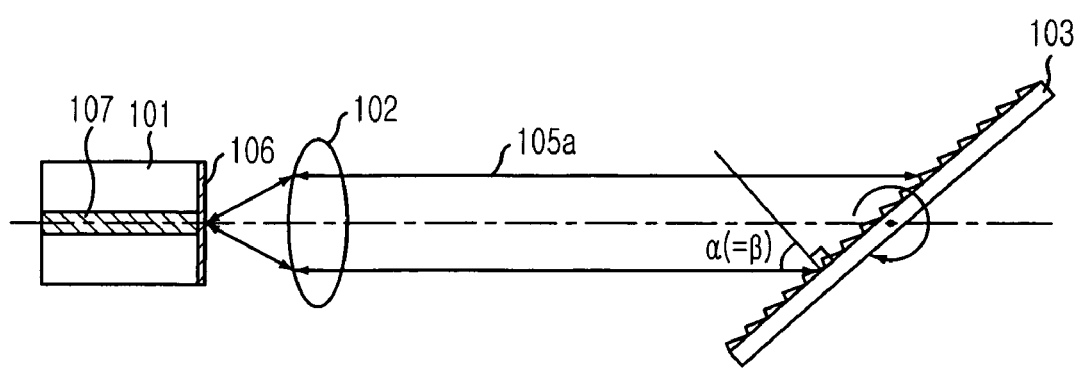
FIG. 2 is a block diagram illustrating a schematic diagram showing a Littrow type external cavity laser diode light source according to a prior art.
Figure 3:
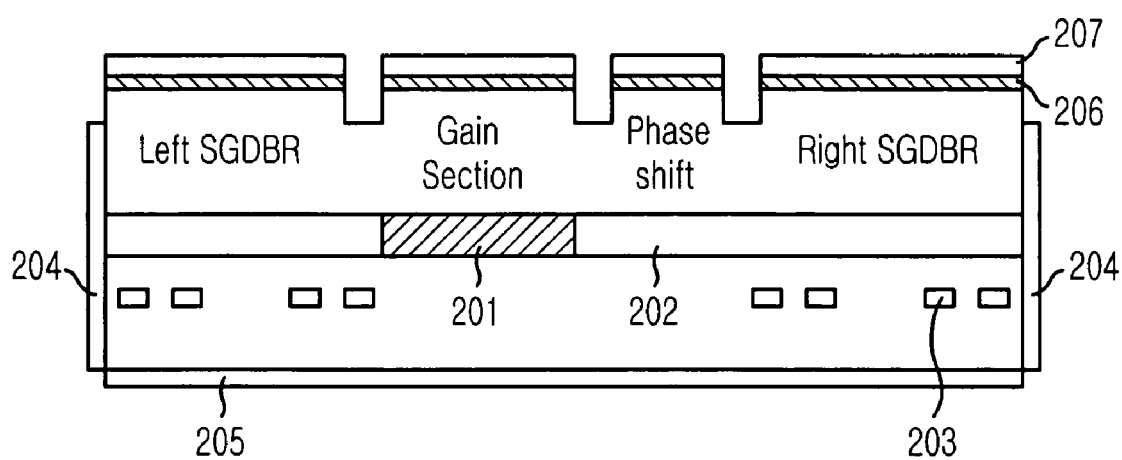
FIG. 3 is a schematic diagram showing a SGDBR (sampled grating distributed Bragg reflector) type tunable semiconductor laser according to a prior art.

Hereinafter, preferred embodiments of the present invention are described in detail with respect to the accompanying drawings. Prior to this, terms or words used in the present specification and claims are not understood with defining them as a conventional or a dictionary meaning, they are understood as meanings and concepts matching to the technical sprit of the present invention based on the fact that the inventor appropriately defines the concepts of terms to describe his invention as the best method. Therefore, since the embodiments described in the present specification and the construction shown in the drawings are only the best preferred embodiment of the present invention and they does not represent all of the technical features of the present invention, it should be understood that various changes and modifications in place of those can be made at the time of filing the present application.

Embodiment 1

The present embodiment relates to a parabolic waveguide-type collimating lens provided with an improved structure and capable of being used for a tunable external cavity laser diode in accordance with the present invention.

Figure 7:
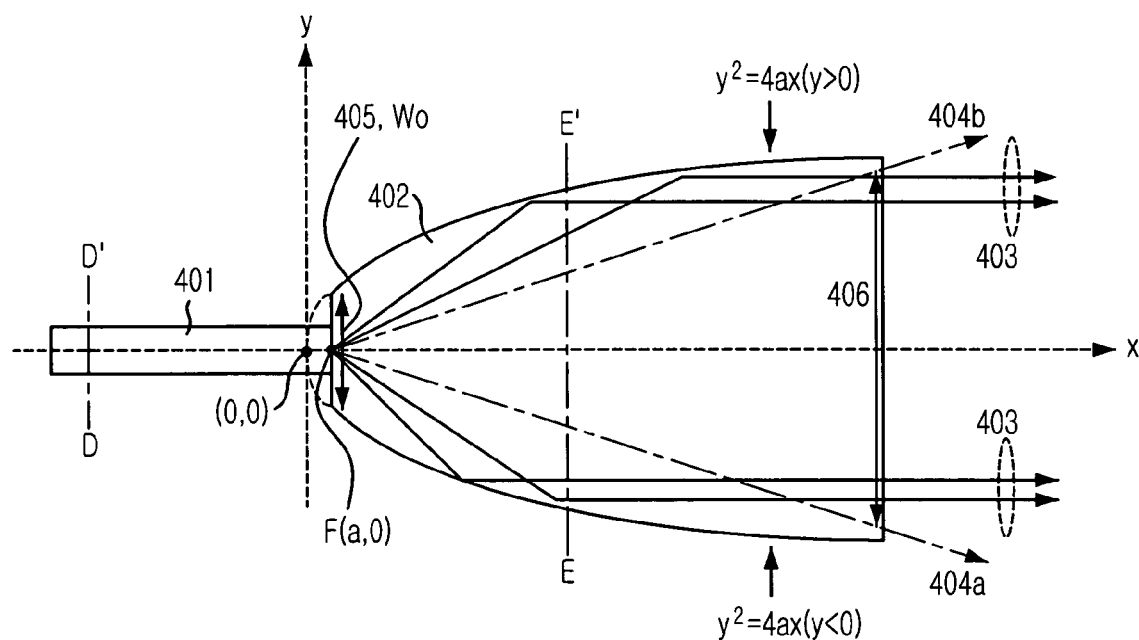
FIG. 7 is a plan view representing a semiconductor based parabolic waveguide-type collimating lens in accordance with an embodiment of the present invention.

FIG. 7 is a plan view representing a semiconductor based parabolic waveguide-type collimating lens in accordance with an embodiment of the present invention.

Referring to FIG. 7, there are shown an input passive waveguide 401 and a parabolic waveguide-type collimating lens 402. An end of the input passive waveguide 401 and an input end of the parabolic waveguide-type collimating lens 402 are placed at a focus F(a, 0) and the parabolic waveguide-type collimating lens 402 is provided with a pair of parabolic waveguides ($y^2=4ax$), wherein the parabolic waveguides are symmetric to each other with respect to the input waveguide.

In this case, an initial width 405 of the parabolic waveguide-type collimating lens 402 is 4a, a width 406 of an output end determines a size of a collimating light beam 403. That is, the parabolic waveguides become adjacent to the input passive waveguide 401 at the focus F(a, 0) of the parabolic waveguides in the parabolic shape of $y^2=4ax$, "a" being a focal length of the parabolic waveguide, and the parabolic waveguides are formed in the shape cut at a point at which the width of the parabolic waveguide-type collimating lens 402 becomes 4a.

Figure 8A:
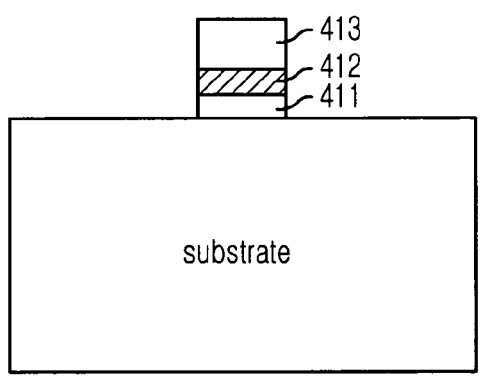
FIGS. 8a and 8b are a cross-sectional view showing the semiconductor based parabolic waveguide-type collimating lens taken along lines D–D' and E–E' of FIG. 7.
Figure 8B:
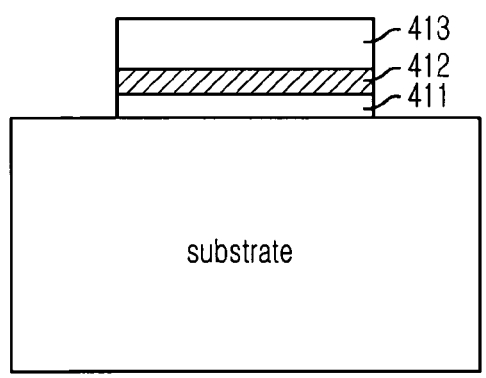

FIGS. 8a and 8b are a cross-sectional view showing the semiconductor based parabolic waveguide-type collimating lens taken along lines D–D' and E–E'. Referring to the drawings, on a compound semiconductor substrate 410 made of a material such as Si, lithium niobate ($LiNbO_3$), InP based material or the like, a bottom clad layer 411, a passive waveguide core layer 412 and a top clad layer 413 are formed sequentially. And, the input passive waveguide 401 and the parabolic waveguide-type collimating lens 402 can be manufactured by a conventional photolithography and RIE (reactive ion etching) processes.

Figure 4:
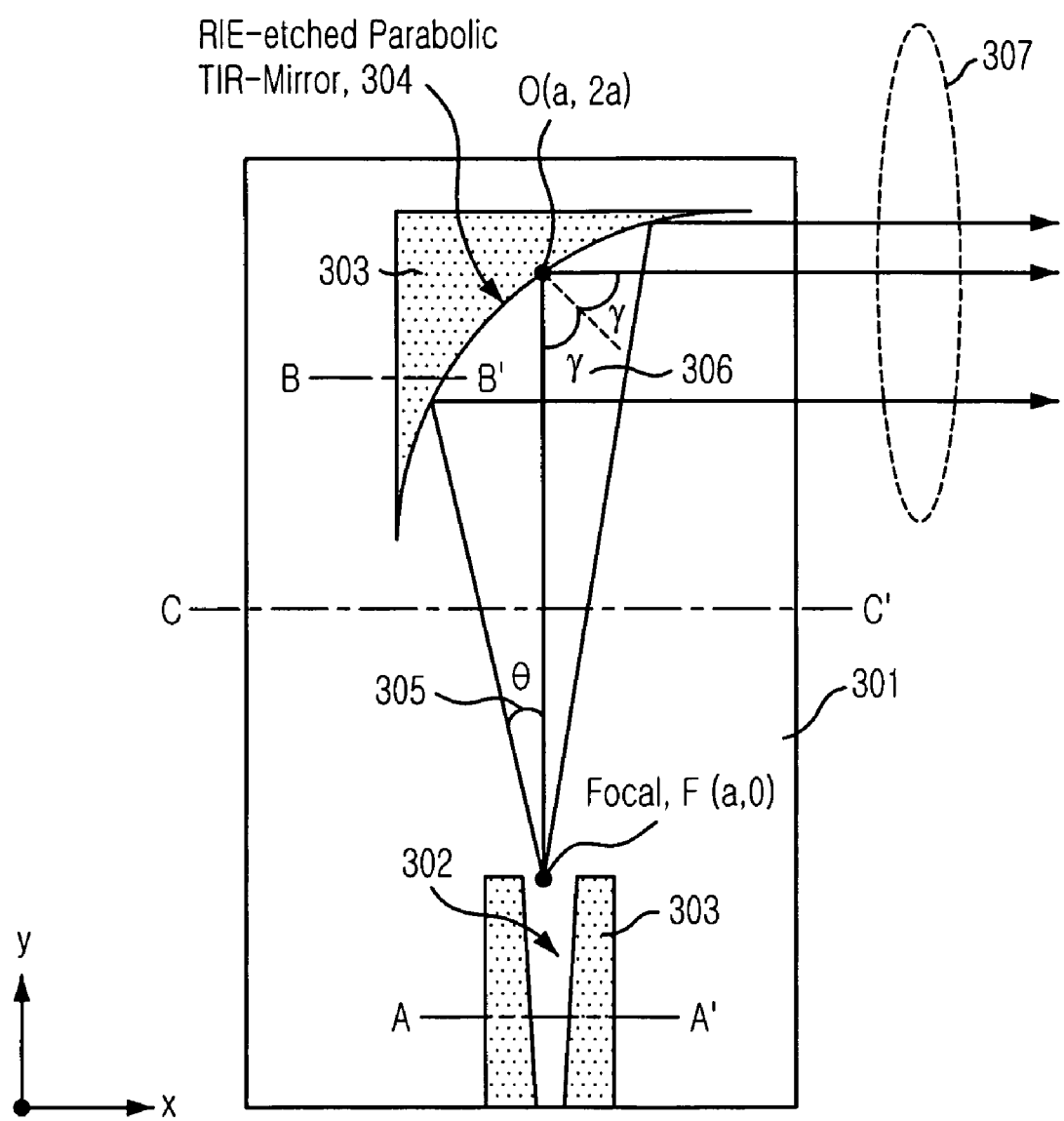
FIG. 4 is a plan view depicting a conventional semiconductor based parabolic reflection mirror.
Figure 5A:
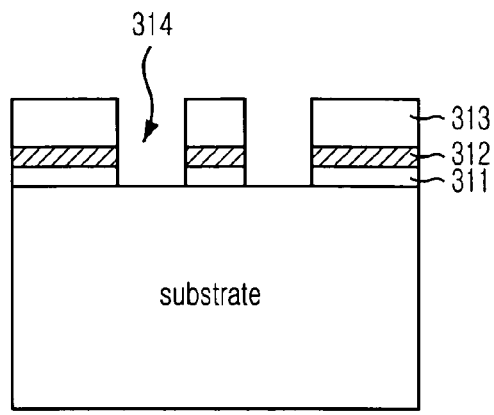
FIGS. 5a to 5c are cross-sectional views illustrating a semiconductor based parabolic reflection mirror taken along lines A–A', B–B' and C–C' of FIG. 4.
Figure 5B:
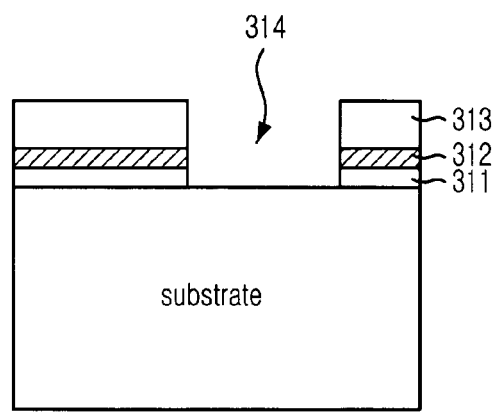
Figure 5C:
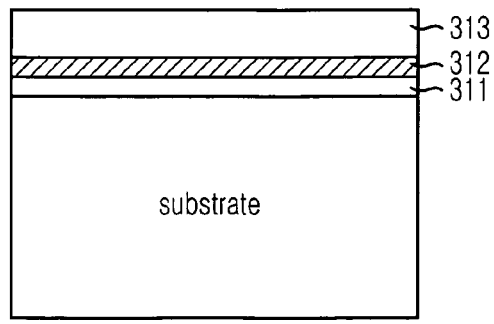
Figure 6:
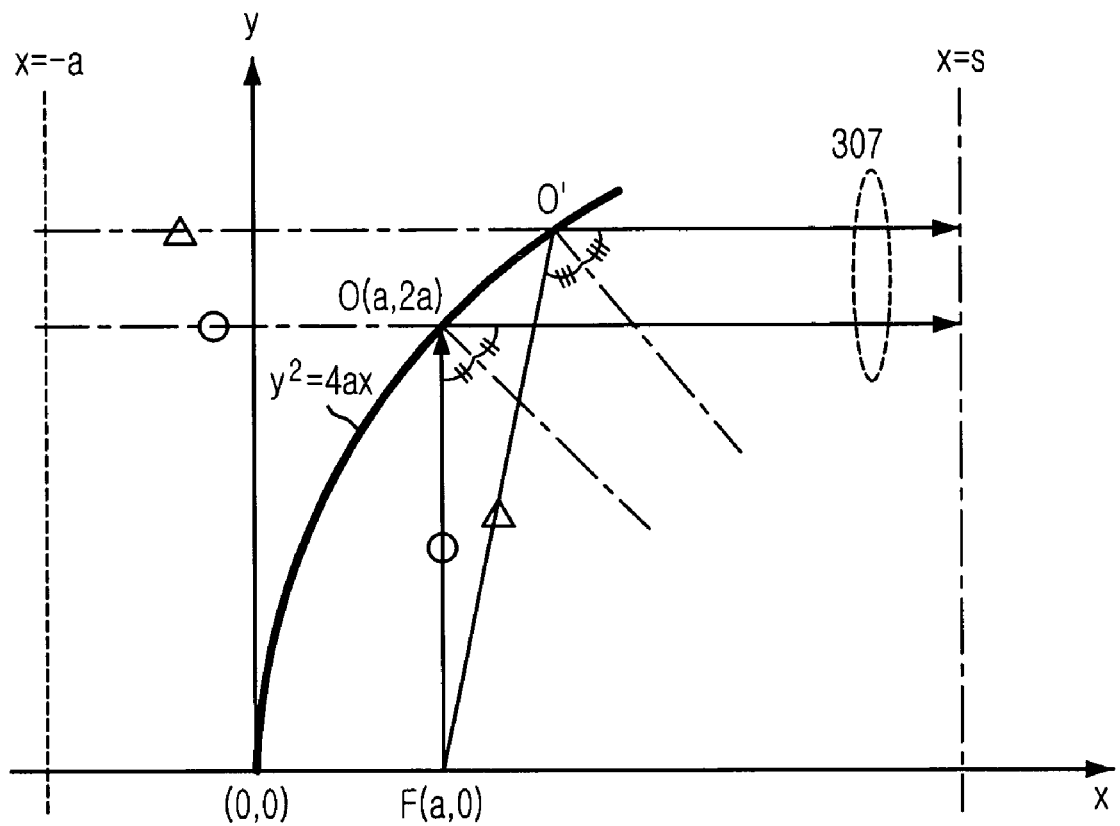
FIG. 6 is a graph depicting the formation of parallel light of the semiconductor based parabolic reflection mirror according to the prior art.

Comparing the present invention in FIG. 7 with the prior art in FIG. 4, the present invention is capable of drastically improving the degree of integration during the manufacture on a wafer by arranging the input waveguide and the output waveguide in a straight line and has an advantage that the size of the outputted collimating light beam can be controlled by using the focus and the length of the parabola. And also, comparing the present invention in FIG. 7 with the prior art in FIG. 4 described in above, the present invention is capable of exactly knowing the position and the size of the outputted collimating light beam and becomes and an excellent uniformity and reproducibility since the size of the outputted collimating light beam is independent of the width of the input passive waveguide and the thickness and the composition of the core layer in the slab passive waveguide layer.

However, in FIG. 7, there is a shortcoming that portions 404a and 404b of the outputted collimating light beam, which are not reflected by the parabolic waveguide-type collimating lens 402 among the light beam emitted from the input passive waveguide 401, do not become a parallel light. That is, if the portions 404a and 404b become to increase, the parabolic waveguide-type collimating lens 402 does not sufficiently play a role as a collimating lens.

Embodiemnt 2

Figure 9:
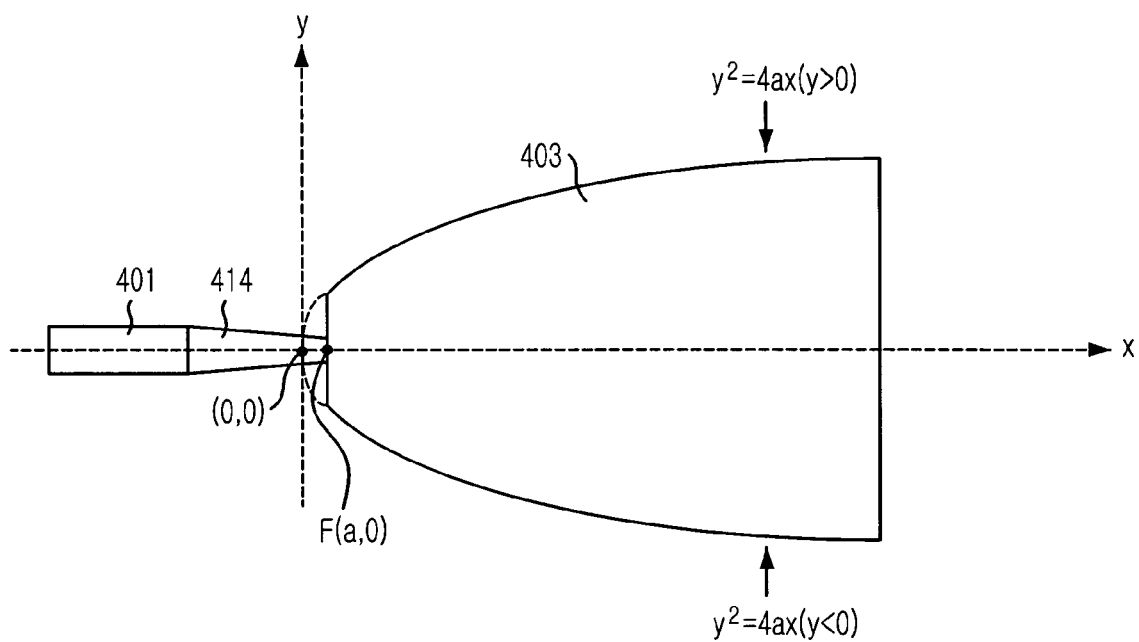
FIG. 9 is a schematic diagram representing a collimating lens provided with a tapered input passive waveguide in accordance of another embodiment of the present invention.

FIG. 9 is a conceptual view adding a tapered passive waveguide 414 being sloped in its width to the input passive waveguide as showing the collimating lens in accordance with another embodiment of the present invention to improve the shortcomings of the external cavity laser diode shown in FIG. 7. If the width of the input passive waveguide becomes to decrease, since a radiation angle becomes to increase during the propagation to a parabolic waveguide-type collimating lens 403, the loss of the light beam can be decreased by relatively reducing the ratio of the light beam not reflected by the parabolic waveguide-type collimating lens.

Figure 10:
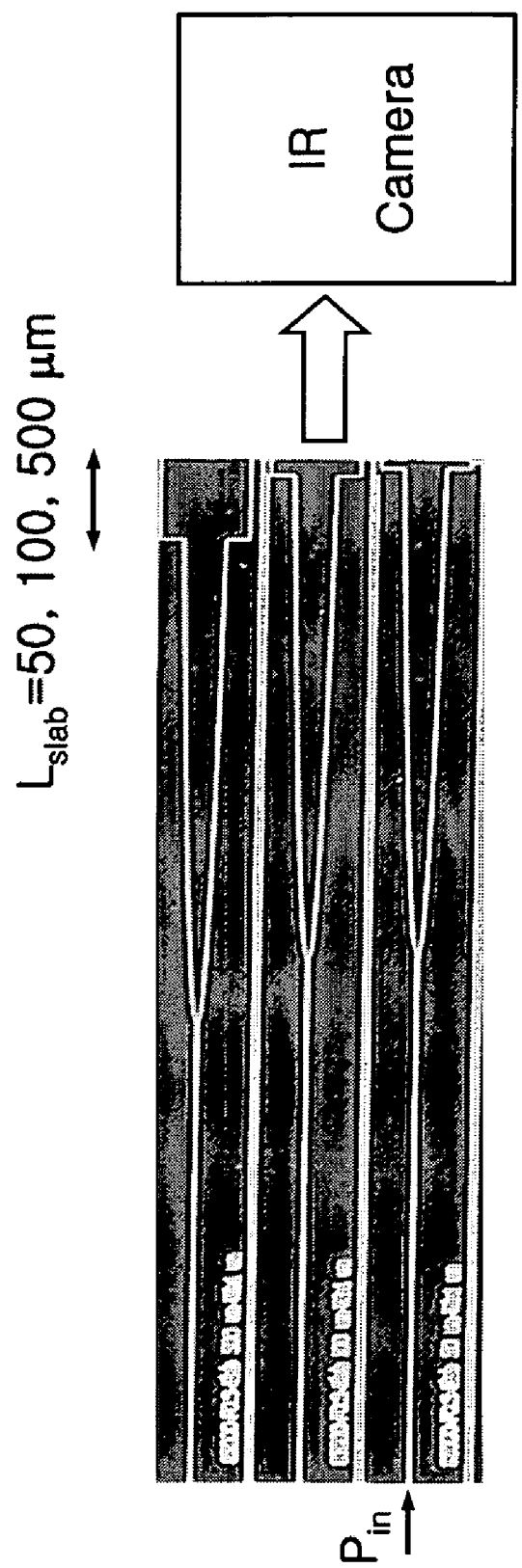
FIG. 10 is a photograph showing a parabolic waveguide-type collimating lens in accordance with the present invention

FIG. 10 is a photograph showing a parabolic waveguide-type collimating lens in accordance with the present invention. And, FIGS. 11a to 11c are near field images of the parabolic waveguide-type collimating lens in accordance with the present invention, respectively.

The manufactured parabolic waveguide-type collimating lens is constructed by the following method. That is, after a bottom clad layer made of, e.g., n-type InP semiconductor, a passive waveguide core layer made of, e.g., undoped InGaAsP semiconductor and an undoped InP top clad layer are formed on a substrate made of, e.g., n-type InP semiconductor, an input passive waveguide, a tapered input waveguide, a parabolic waveguide-type collimating lens and a slab waveguide shown in FIG. 10 are manufactured by a conventional photolithography process and an RIE process. In accordance with the embodiment of the present invention, it is preferable that the passive waveguide core layer has a thickness ranging from 0.30–0.40 μm and the bandgap of the undoped InGaAsP semiconductor is ranged from 1.20 μm to 1.28 μm. A light beam is injected into the manufactured parabolic waveguide-type collimating lens using an optical fiber and the near field images are photographed by an IR (Infra-red) camera installed at the output end of the parabolic waveguide-type collimating lens.

As shown in FIGS. 11a to 11c, a spatial multi-mode is not generated in response to the change of the slab length, it can be understood that the light beam is outputted as a substantial parallel light beam in a view that the outputted light beam does not change greatly although the outputted light beam travels through the slab waveguides having a length different from each other.

Embodiemnt 3

The present embodiment relates to a tunable external cavity laser diode provided with an optical deflector capable of varying the direction of light beam through the change of a refraction index due to an electrical change or a thermal change. To generate a parallel light beam impinging onto the optical deflector, although it is preferred to use the collimating lens of the first embodiment or the collimating lens of the second embodiment, a bulk-type collimating lens (or a plano-convex lens filled with a predetermined medium having a refractive index different from that of the waveguide) according to a conventional method can be used. In the following description, the tunable external cavity laser diode provided with the collimating lens of the second embodiment being the most excellent in operational quality among these will be described in detail.

Figure 12:
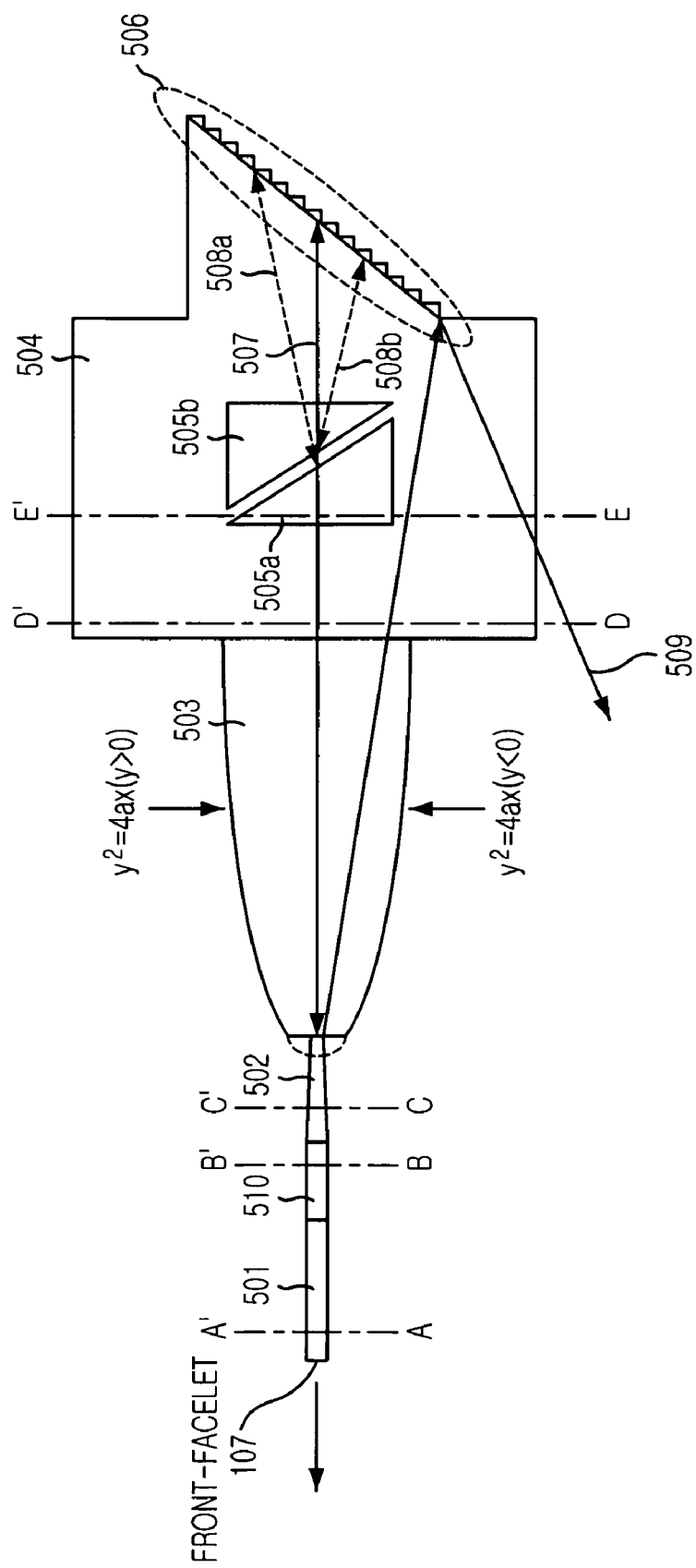
FIG. 12 is a schematic diagram illustrating a schematic diagram showing a Littrow type monolithically integrated tunable external cavity laser diode light source in accordance with an embodiment of the present invention.

FIG. 12 is a schematic diagram illustrating a schematic diagram showing a Littrow type monolithically integrated tunable external cavity laser diode light source in accordance with an embodiment of the present invention.

Referring to FIG. 12, the basic construction of the present tunable external cavity laser diode includes an active waveguide 501 serving as a gain medium having a wide wavelength range and a passive waveguide 502 connected by a butt-joint. And, the present tunable external cavity laser diode further includes a phase control part 510 formed on the passive waveguide 502, the passive waveguide 502 tapered in its width, a parabolic waveguide-type collimating lens 503, a slab waveguide 504, a pair of triangular optical deflectors 505a and 505b and a diffraction grating 506.

A light beam generated at the gain medium having the wide wavelength range is outputted as a parallel light beam having a sufficient beam size at the parabolic waveguide-type collimating lens 503, since only a specific single wavelength diffracted by the diffraction grating 506 is feedbacked to the active waveguide 501, the specific single wavelength is outputted to the front-facet of the active waveguide 501. At this time, if an electric signal is applied to the optical deflectors 505a and 505b placed at the slab region, the direction of the light beam is changed by Snell's law in response to the change of the refractive index due to an electrical or a thermal change. Therefore, a wavelength of the single wavelength light beam outputted in response to the change of incidence angle inputted to the diffraction angle 506 is changed as shown in the mathematical equation 2.

The optical deflectors 505a and 505b in the slab waveguide 504 are implemented by forming p/n junction regions in predetermined regions of the slab waveguide 504. That is, the p/n junctions are planarly formed on only portions in the form of triangle in the slab waveguide 504 formed by a compound semiconductor such as InP or GaAs or the like capable of forming the slab waveguide 504, thereby changing the refraction index due to the change of carrier densities or an electro-optic effect in response to the voltage applied to the p/n junction regions or the injected current. In this result, when the light beam traveling in the slab waveguide 504 passes through the triangle portions of the p/n junction regions, the refraction angle of the light beam can be controlled by using the voltage or the current applied to the p/n junction regions. At this time, the refractive index is changed by the change of carrier density of the slab waveguide 504 or an electro-optic effect such as a QCSE (quantum confined Stark effect) in response to the voltage or the current applied to the p/n junction regions.

Therefore, the light beam can be refracted at the interface between slab waveguide 504 and optical deflector 505a and 505b. In case of the slab waveguide 504 made of InP and InGaAsP, the refractive index can be changed up to 0.05 in maximum by changing the carrier density to approximately $5 \times 10^{18}$ cm$^{-3}$. Accordingly, all of elements to be required for constructing the tunable external cavity laser diode can be integrated into a single substrate. And also, the optical deflector can be constructed as a pair of forward direction and backward direction triangles.

In accordance with the embodiments of the present invention, it is preferable that a light beam 509, which does not become a parallel light beam since it is not reflected by the parabolic waveguide-type collimating lens 503, is not reflected back to the parabolic waveguide-type collimating lens 503 by reflecting to a region on which the diffraction grating 506 is not formed. This is achieved by making the size of the diffraction grating 506 to be equal to that of the output end of the parabolic waveguide-type collimating lens 503.

Hereinafter, the detail manufacturing processes in response to the present semiconductor process for each of the construction parts will be described.

Figure 13A:
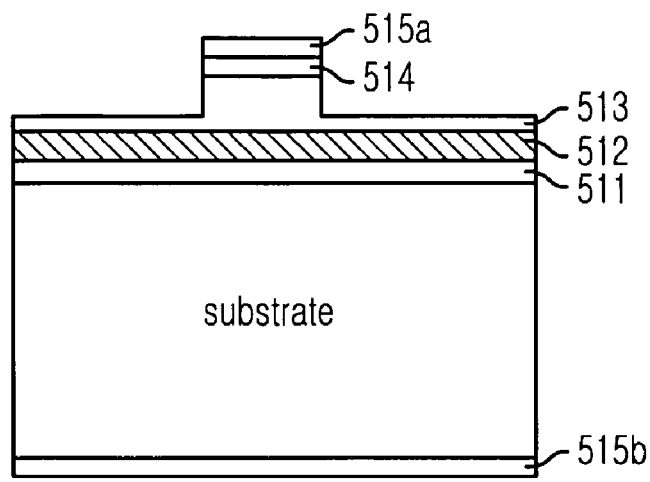
FIGS. 13a and 13b are cross-sectional views depicting the Littrow type monolithically integrated tunable external cavity laser diode light source taken along lines A–A' and B–B' of FIG. 12.
Figure 13B:
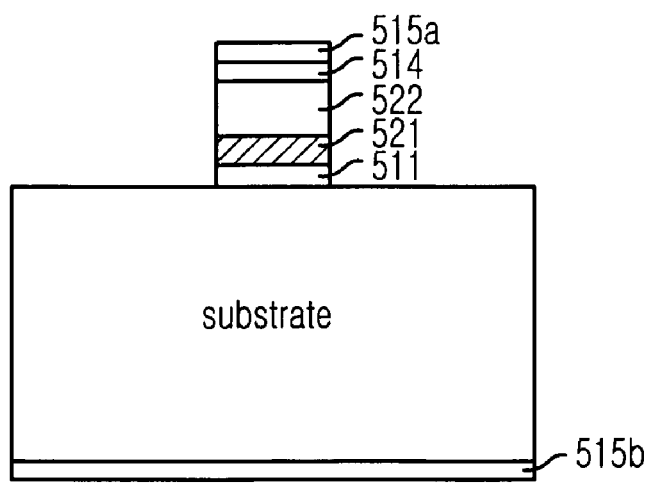
Figure 13C:
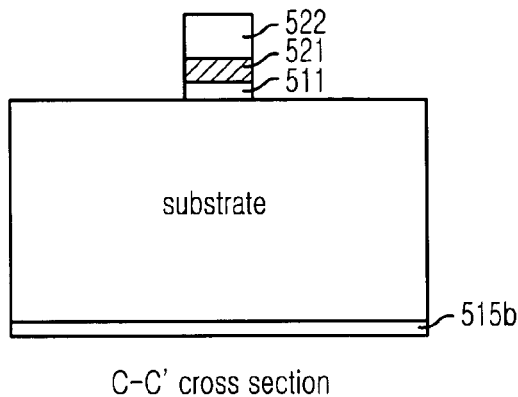
FIGS. 13c to 13e are cross-sectional views illustrating the Littrow type monolithically integrated tunable external cavity laser diode light source taken along lines C–C', D–D' and E–E' of FIG. 12.
Figure 13D:
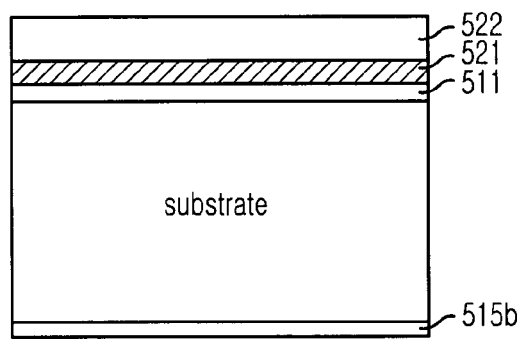
Figure 13E:
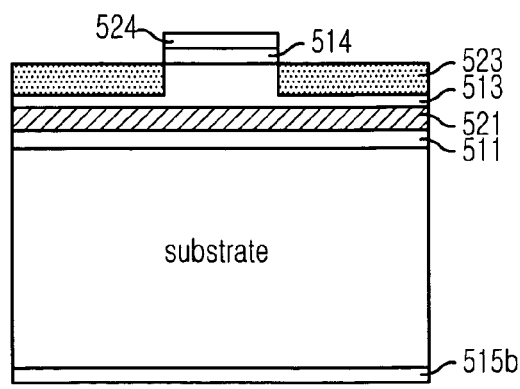

FIGS. 13a and 13b are cross-sectional views depicting the Littrow type monolithically integrated tunable external cavity laser diode light source taken along lines A–A' and B–B' of FIG. 12. And, FIGS. 13c to 13e are cross-sectional views illustrating the Littrow type monolithically integrated tunable external cavity laser diode light source taken along lines C–C', D–D' and E–E' of FIG. 12.

A method for manufacturing a Littrow type monolithically integrated tunable external cavity laser diode light source in accordance with an embodiment of the present invention is as follows.

At first, after a bottom clad layer 511 made of, e.g., n-type or undoped InP semiconductor, a core layer 512 of an active waveguide constructed by a multi-quantum well structure made of an undoped InGaAsP well/InGaAsP barrier and a clad layer 513, e.g., made of a p-type InP semiconductor, are sequentially formed on a substrate 410 made of, e.g., n-type InP semiconductor, an etching is performed from the passive waveguide region except the active waveguide region to the core layer of the active waveguide by a conventional photolithography process and an RIE process. In accordance with an embodiment of the present invention, it is preferable that the multi-quantum well structure has a bandgap ranged from 1.50 μm to 1.60 μm.

Thereafter, the undoped InGaAsP layer 521 of the passive waveguide is grown by a butt-joint process. In accordance with an embodiment of the present invention, it is preferable that the undoped InGaAsP of the passive waveguide has a bandgap ranged from 1.20 μm to 1.28 μm. Sequentially, the p-type InP clad layers 513 and 522 and the p-type InGaAs ohmic contact layer 514 are grown.

Figure 14A:
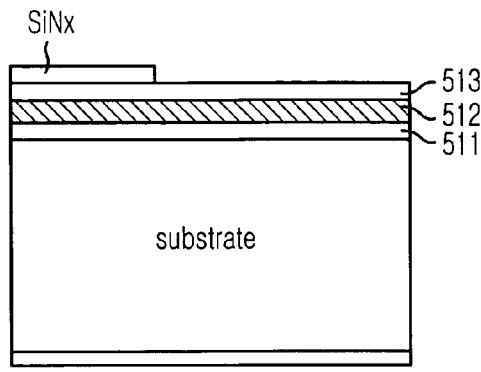
FIGS. 14a to 14c are cross-sectional views representing a butt-joint technique to form the waveguide layer of the present invention.
Figure 14B:
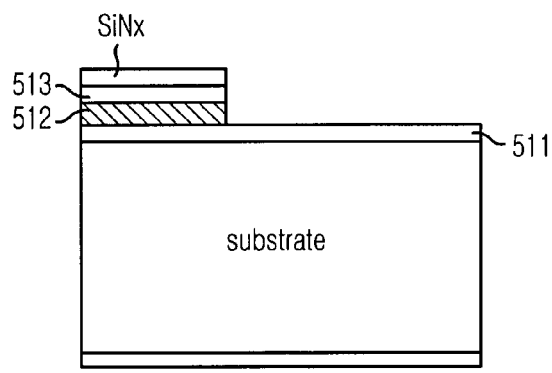
Figure 14C:
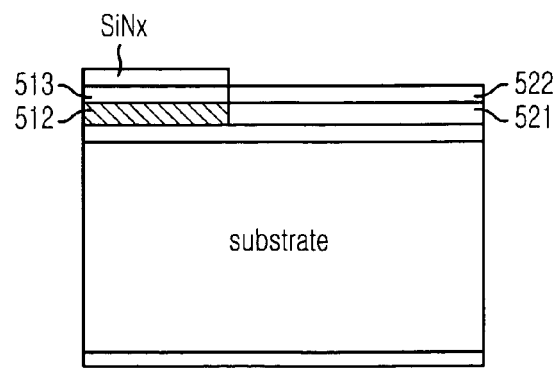

FIGS. 14a to 14c are cross-sectional views representing a process for connecting the active waveguide layer 512 to the passive waveguide layer 521 by the butt-joint technique. FIG. 14a illustrates a patterning process, FIG. 14b illustrates an RIE process and FIG. 14c illustrates a process for regrowing the passive waveguide layer 521. Since the butt-joint technique shown in the drawings is well known for the people skilled in the art, the detail description therefore will be omitted herein.

That is, the active waveguide is formed into a shallow ridge type waveguide pattern by a conventional photolithography, an RIE process and a wet etching process, and the passive waveguide is formed into a deep ridge structure. Finally, the top electrode 515a and the bottom electrode 515b are formed. During the formation of the top/bottom electrodes, the optical deflector 524 can be formed together according to the implementation.

On the other hand, to reduce the leakage current of the injection current in the optical deflector, it is preferable that a current blocking layer 523 is formed on a top and sides of the top clad layer 513 in the passive waveguide region.

Figure 15:
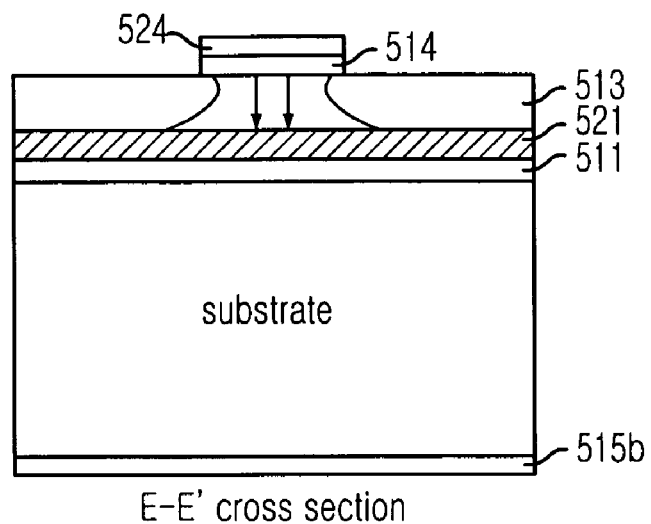
FIG. 15 is a cross-sectional view describing a leakage current generated at an optical deflector in accordance with an embodiment of the present invention.

FIG. 15 is a cross-sectional view describing a leakage current generated at an optical deflector in accordance with an embodiment of the present invention.

To implement a wavelength tuning as one of features of the present invention, a current is injected into the triangular optical deflector and the refractive index of the medium is changed by making the injected current confined at the core layer 521 of the passive waveguide (by the bandgap difference between the top clad layer and the bottom clad layer). However, as shown in the drawings, while the injected current is passing through the p-type InP top clad layer 513, it is not confined down along a straight line in a vertical direction, but it is dispersed to the sides by the diffusion.

Therefore, it is ideally important that the current is confined into only the triangular optical deflector (without diffusing to the sides) and the current is injected into only the core layer of the passive waveguide below the triangular shape. However, the leakage current is increased when the injected current is diffused to the sides as shown in the drawings; it is possible to that the interface changing its refraction index is not a right triangle. In order to reduce the injection current diffusion phenomena of the p-type top clad layer 513, it is preferable that the current blocking layer is employed.

An undoped InP current barrier layer, a InP layer doped with a semi-insulating material or an ion implantation may be utilized as the current blocking layer.

And also, preferably, it is advantageous that the top clad layer 513 of the core layer in the passive waveguide is made of the undoped InP current blocking layer or the InP layer doped with the semi-insulating material in increasing the output optical intensity of the tunable external cavity laser diode light source to reduce the optical loss.

Figure 16:
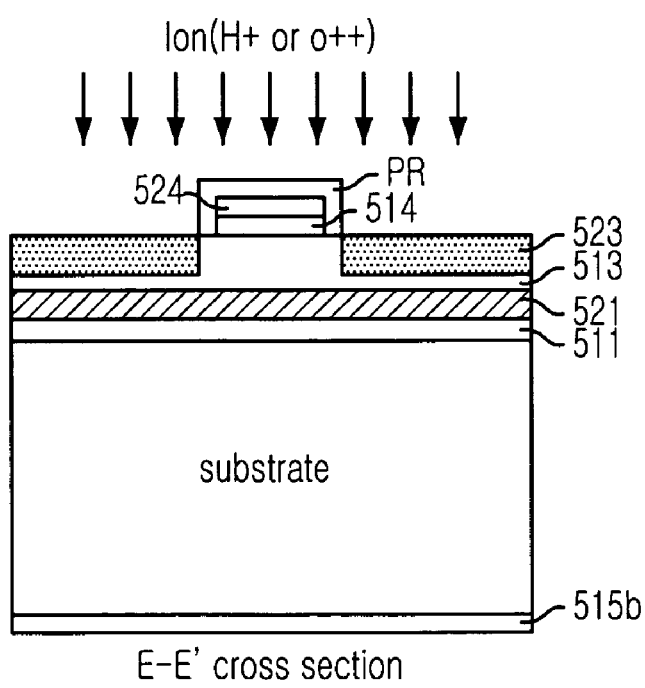
FIG. 16 is a cross-sectional diagram showing a structure to prevent the leakage current of FIG. 15 by an ion implant process.

FIG. 16 is a cross-sectional diagram showing a structure to prevent the leakage current by an ion implant process.

Generally, it is well known for the people skilled in the art that a method for preventing the current diffusion in the p-type clad layer by drastically increasing the resistivity of the p-type clad layer, wherein this is achieved by injecting an implant such as hydrogen or oxygen or the like into the p-type clad layer. In the method, after the region where the current is injected into is protected from the ion implant by coating a photoresist pattern, if the ions are implanted at an ion implanter, the current blocking layer with a high resistivity is formed on the top clad layer except for the current injection region. At this time, a depth of penetrating the ion implant into the substrate can be controlled by changing the acceleration energy of the ion implanter.

Figure 17A:
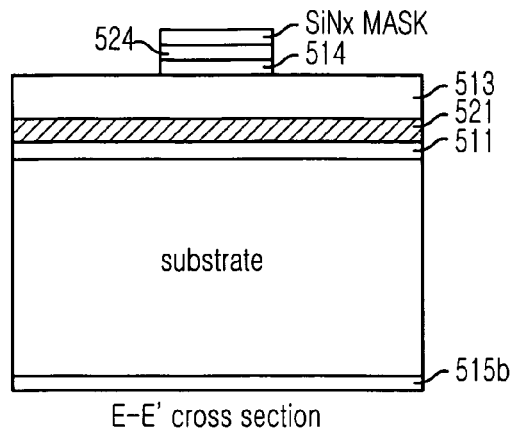
FIGS. 17a to 17c are cross-sectional diagrams representing structures to prevent the leakage current of FIG. 15 by growing an undoped InP layer or a semi-insulating InP layer.
Figure 17B:
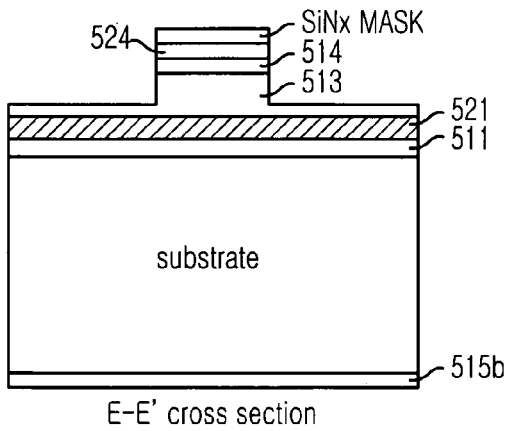
Figure 17C:
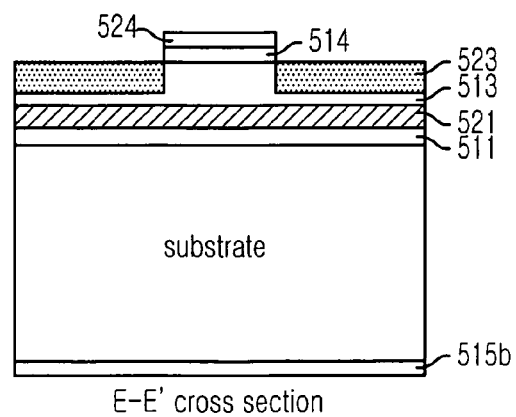

FIGS. 17a to 17c are cross-sectional diagrams representing structures to prevent the leakage current by growing an undoped InP layer or a semi-insulating InP layer. These are achieved by performing a conventional photolithography (shown in FIG. 17a), an RIE process (shown in FIG. 17b) and a regrowing process (shown in FIG. 17c).

FIG. 18 is a graph showing wavelength tunable characteristics in response to an injection current of an optical deflector in the Littrow type monolithically integrated tunable external cavity laser diode manufactured in accordance with the embodiment of the present invention. And, FIG. 19 is a graph illustrating continuous wavelength tunable characteristics in response to an injection current of a phase control part in the Littrow type monolithically integrated tunable external cavity laser diode manufactured in accordance with the embodiment of the present invention.

At first, referring to FIG. 18, there is shown that the single wavelength is varied at the Littrow type monolithically integrated tunable external cavity laser diode proposed in the present invention in response to the change of the injection current of the optical deflectors 505a and 505b.

Figure 19:
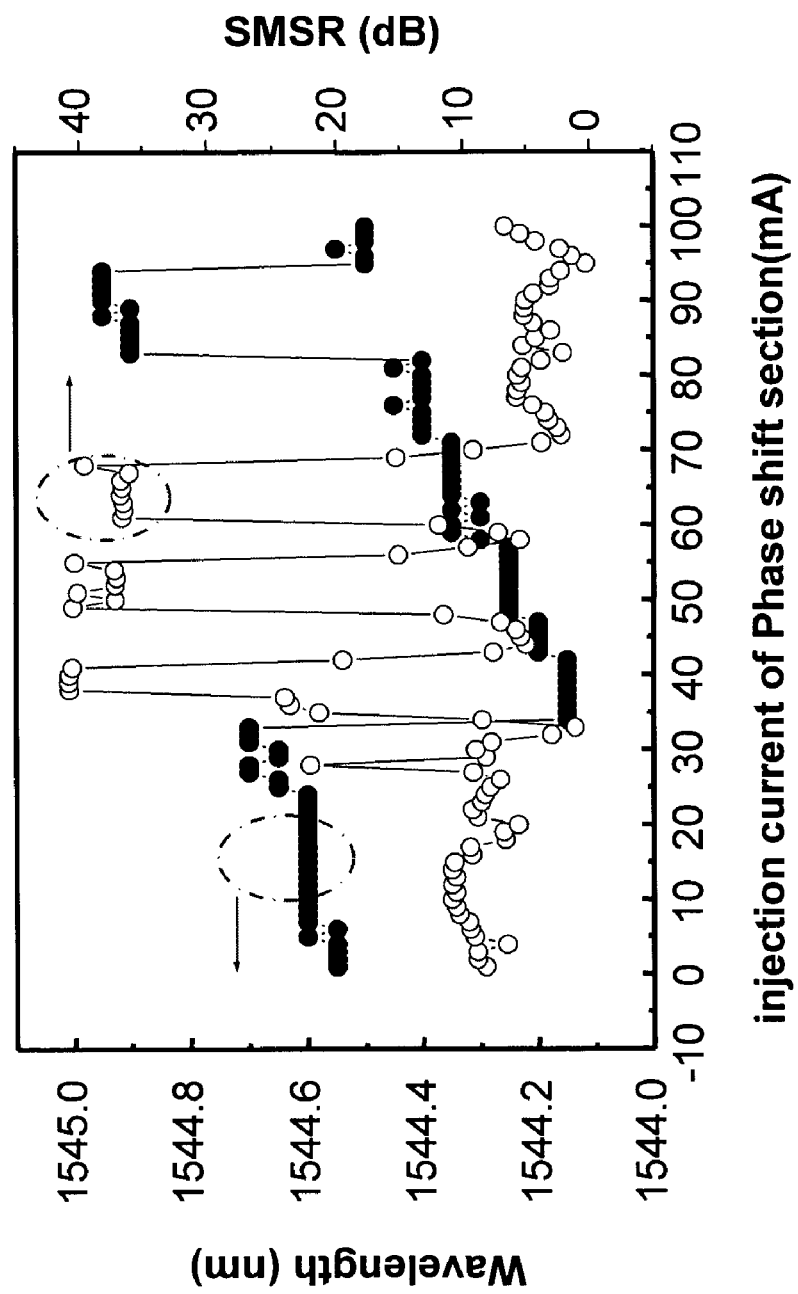
FIG. 19 is a graph illustrating a continuous wavelength tunable characteristics in response to an injection current of a phase control part in the Littrow type monolithically integrated tunable external cavity laser diode manufactured in accordance with the embodiment of the present invention.

And also, referring to FIG. 19, there is shown that the wavelengths can be tuned in quasi-continuous ranging approximately 0.05 nm in response to the change of the injection current in the phase shift section while the injection current of the active waveguide 501 and the injection currents of the optical deflectors 505a and 505b are fixed. And, it represents very excellent characteristics that the oscillation wavelength has a SMSR (side mode suppression ratio) of 40 dB.

It is possible that the core layer of the active waveguide described above embodiment of the present invention employs the InGaAs bulk structure. And, it is also possible that the core layer of the passive waveguide described above embodiment of the present invention employs a multi-quantum well structure with an InGaAsP well/InGaAsP barrier.

Figure 20:
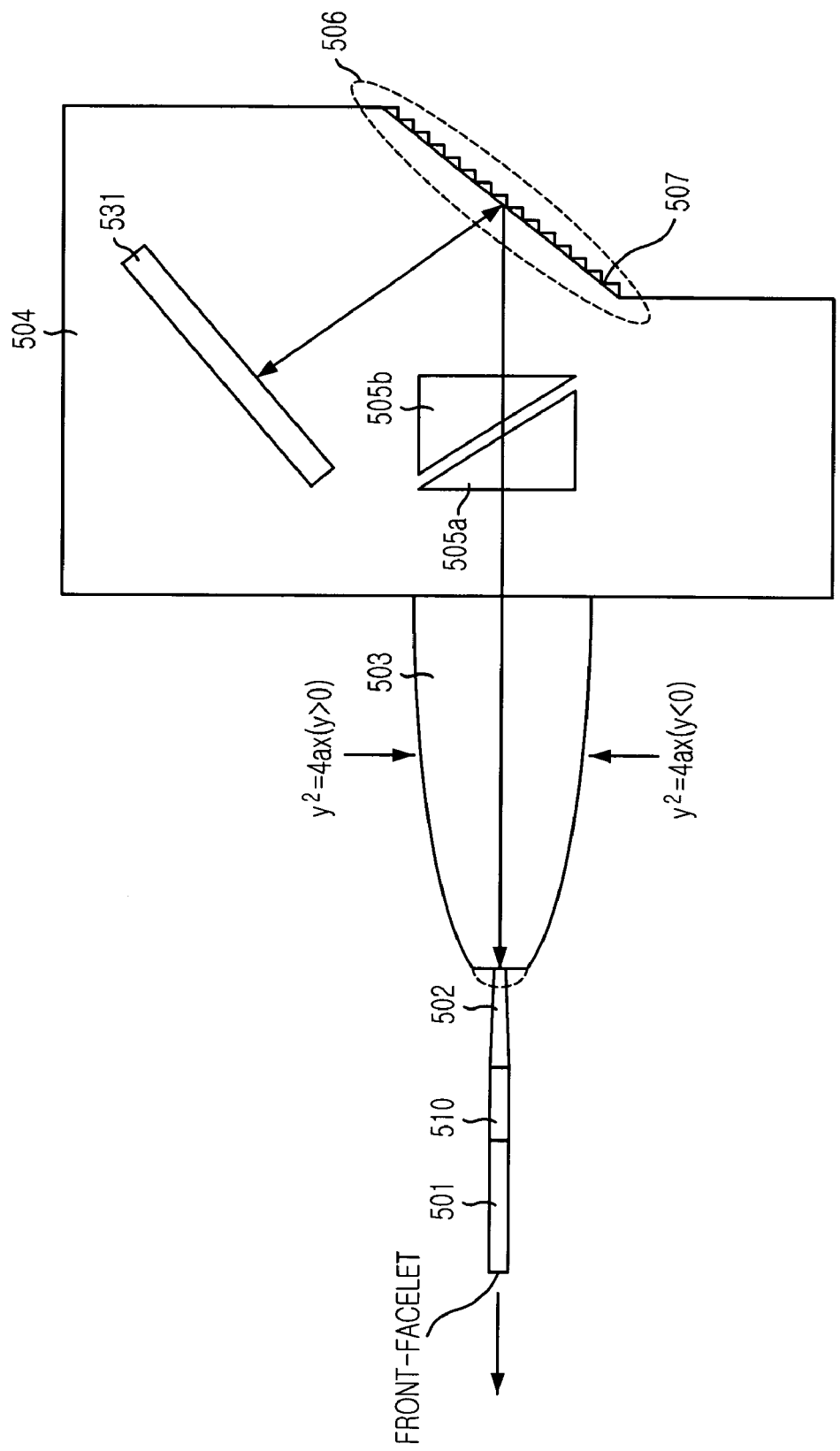
FIG. 20 is a schematic diagram illustrating a Littman-Metcalf type monolithically integrated tunable external cavity laser diode light source in accordance with an embodiment of the present invention.

FIG. 20 is a schematic diagram illustrating a Littman-Metcalf type monolithically integrated tunable external cavity laser diode light source in accordance with an embodiment of the present invention, wherein the like numerals of FIG. 12 and FIG. 20 represent the same structure and the same function. Although the whole manufacturing method or the structure and the operational principle are similar to those of FIG. 12, this embodiment is characterized in that it includes a reflection mirror 531 etched by a RIE process. At this time, only the specific single wavelength is oscillated by feeding only the beam inputted to the etched reflection mirror in vertical back to the diffraction grating 506.

However, the cross-section etched by the RIE plays a role of a reflection mirror and the loss of the light beam due to the reflection mirror becomes relatively large without satisfying the condition of the total reflection since the light beam is inputted in a vertical direction.

In accordance with the embodiment of the present invention, it is preferable in improving the output characteristics that a material such as Al, Au, Ag, Pt or the like representing a high reflectivity is deposited on the cross-section etched by the RIE process or a thin film having a high reflectivity above 90% is added by depositing a dielectric thin film.

Embodiemnt 4

The present embodiment relates to a tunable external cavity laser diode capable of manufacturing the tunable external cavity laser diode structure, wherein the tunable external cavity laser diode structure is integrated by separately forming the gain medium portion and the tunable portion by using the anti-reflection layers 514a and 514b.

FIG. 21 is a schematic diagram representing a Littrow type hybrid integrated tunable external cavity laser diode light source in accordance with an embodiment of the present invention. It should be noted that the like numerals of FIG. 12 and FIG. 21 represent the same structure and the same function.

Referring to FIG. 21, it should be noted that the gain medium portion and the tunable portion be separately manufactured by the anti-reflection layers 514a and 514b. Specifically, after two portions, i.e., a first portion integrated thereon the active waveguide 501 and the parabolic waveguide-type collimating lens 503 and a second portion formed thereon the slab waveguide 504, the optical deflectors 505a, 505b and the diffraction grating 506, are manufactured, a hybrid integrated tunable external cavity laser diode can be implemented. The hybrid integrated tunable external cavity laser diode has an advantage that it can be separately manufactured a material having an excellent gain medium and a material having excellent tunable characteristics since it can be separately manufactured into the gain medium portion and the tunable portion.

FIG. 22 is a schematic diagram describing a Littman-Metcalf type hybrid integrated tunable external cavity laser diode light source in accordance with an embodiment of the present invention. Therefore, the present embodiment has the structure similar to that of FIG. 20.

On the other hand, the gain medium, the phase shift portion and the collimating lens are integrated into the first region as one and the slab waveguide, the optical deflectors and the diffraction grating are integrated into the second region as one. And also, the gain medium, the phase shift portion and the collimating lens are integrated into the first region and the slab waveguide, the optical deflectors, the reflection mirror and the diffraction grating are integrated into the second region as one.

Although the present invention is described with reference to the certain embodiments and drawings, it is not limited thereto and it will be apparent to those skilled in the art that various changes and modifications may be made without departing from the scope of the invention as defined in the following claims.

For example, the substrates described in the above first to fourth embodiments can employ an InP-based semiconductor as well as a material such as a GaAs-based semiconductor, a Si-based semiconductor, $LiNbO_3$-based semiconductor or the like. The cross-sectional structure of the active waveguide can employ a PBH (planar buried hetero-structure) or a BRS (buried ridge stripe) structure in place of the shallow ridge structure. And, the active waveguide can employ an InP-based semiconductor as well as various media such as GaAs-based semiconductor, a GaN-based semiconductor, a Si-based semiconductor doped with rare-earth atoms such as an erbium, a polymer doped with rare-earth atoms or the like. And also, the substrate or the passive waveguide can employ an InP-based semiconductor as well as various media such as GaAs-based semiconductor, a GaN-based semiconductor, a Si-based semiconductor, a polymer, lithium niobate ($LiNbO_3$) or the like.

On the other hand, a refractive index can be changed by a thermal effect due to the injection current if a metal such as tungsten having some degree of resistance is used as top electrodes of optical deflectors.

In accordance with the embodiment of the present invention, the present tunable external cavity laser diode has an effect that it improves the performance of the wavelength multiplexing system requiring the continuous wavelength tuning characteristics without generating a mode hopping by allowing it to perform the wavelength tuning at a high speed by integrating the gain medium and the parabolic waveguide-type collimating lens as one.

And also, by performing the change of the oscillation wavelength without a mechanical apparatus, the present invention improves the durability and saves the manufacturing cost.

The present application contains subject matter related to Korean Patent Application No. 2005-46155, filed in the Korean Patent Office on May 31, 2005, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A parabolic waveguide-type collimating lens, comprising:
   an input waveguide receiving a light beam from outside; and
   a parabolic waveguide to compensate the light beam transmitted from the input waveguide to a parallel light, wherein an end of the input waveguide and an input end of the parabolic waveguide are placed at a focal point of the parabolic waveguide, and a width of the input end of the parabolic waveguide is approximately 4 times of a distance from a vertex to a focus of the parabolic waveguide.

2. The parabolic waveguide-type collimating lens as recited in claim 1, wherein the input waveguide includes a taper shape provided with a minimum width at a point contact to the parabolic waveguide as a portion connected to the parabolic waveguide becomes to decrease in width.

3. The parabolic waveguide-type collimating lens as recited in claim 1, wherein the input waveguide and the parabolic waveguide are formed in a shape of thin film with a predetermined thickness by being manufactured through a semiconductor stack process.

* * * * *